(12) United States Patent
Ferstenberg

(10) Patent No.: US 7,702,120 B1
(45) Date of Patent: Apr. 20, 2010

(54) SELF-AMPLIFIED LOUDSPEAKERS WITH SWITCHING AMPLIFIER TECHNOLOGY

(75) Inventor: Isaac Ferstenberg, Edgewater, NJ (US)

(73) Assignee: Bogen Communications, Inc., Ramsey, NJ (US)

( * ) Notice: Subject to any disclaimer, the term of this patent is extended or adjusted under 35 U.S.C. 154(b) by 968 days.

(21) Appl. No.: 11/332,143

(22) Filed: Jan. 17, 2006

Related U.S. Application Data

(60) Provisional application No. 60/648,485, filed on Jan. 31, 2005, provisional application No. 60/678,110, filed on May 5, 2005.

(51) Int. Cl.
*H03F 99/00* (2009.01)
(52) U.S. Cl. .................... 381/121; 381/117; 330/251
(58) Field of Classification Search ............... 381/117, 381/120, 121, 28, 111, 123, 81, 116; 330/10, 330/251, 207 A
See application file for complete search history.

(56) References Cited

U.S. PATENT DOCUMENTS

| | | | | |
|---|---|---|---|---|
| 4,688,002 | A * | 8/1987 | Wingate | 330/298 |
| 5,020,101 | A * | 5/1991 | Brotz et al. | 379/388.02 |
| 5,410,592 | A | 4/1995 | Wagner et al. | |
| 5,636,288 | A * | 6/1997 | Bonneville et al. | 381/110 |
| 6,211,728 | B1 | 4/2001 | Chen et al. | |
| 6,243,472 | B1 | 6/2001 | Bilan et al. | |
| 6,262,632 | B1 | 7/2001 | Corsi et al. | |
| 6,388,906 | B1 * | 5/2002 | Ferstenberg | 363/86 |
| 6,614,297 | B2 | 9/2003 | Score et al. | |
| 6,646,507 | B1 | 11/2003 | Prokin et al. | |
| 7,076,070 | B2 * | 7/2006 | Pearce et al. | 381/120 |
| 2004/0161122 | A1 | 8/2004 | Nielsen | |
| 2004/0169552 | A1 | 9/2004 | Butler | |
| 2004/0232978 | A1 | 11/2004 | Easson et al. | |
| 2008/0037807 | A1 * | 2/2008 | Honda | 381/120 |
| 2009/0092267 | A1 * | 4/2009 | Wu et al. | 381/120 |

\* cited by examiner

*Primary Examiner*—Curtis Kuntz
*Assistant Examiner*—Hai Phan
(74) *Attorney, Agent, or Firm*—Collard & Roe, P.C.

(57) ABSTRACT

The present invention utilizes switching power amplifier technology to improve the performance of self-amplified speaker system. In contrast to analog Class A and Class AB amplifiers, the present invention utilizes a digital class D amplifier. Class D amplifiers are a pulse width modulated or digital switching amplifier configuration. The Class D amplifiers of the present invention includes 2-pole compensation feedback and power supply tracking that improves stability and total harmonic distortion over conventional power amplifiers. Class D amplifiers have an average electrical efficiency value of at least 65%. This level of electrical efficiency leads to reduction in the amount of power lost in the device or systems that result in heat generation. More specifically, the present invention utilizes Class D and other switching power amplifier topologies; amplitude scaling; and 2-pole compensation to increase electrical efficiency and physical operating range; and to reduce power supply requirements, heat generation and physical size of self-amplified speaker apparatus and systems. These design characteristics of the present invention provide speaker systems with the capability to operate with less total harmonic distortion and extend the operation range to at least twice the geographical distance or utilize at least twice as many self-amplified speaker systems.

18 Claims, 7 Drawing Sheets

SELF-AMPLIFIED LOUDSPEAKERS WITH SWITCHING AMPLIFIER TECHNOLOGY

BACKGROUND OF THE INVENTION

The present invention relates generally to the fields of amplifier and speaker apparatus and more particularly to a method and system for improving the average electrical efficiency of a switching power amplifier in a speaker apparatus or system.

Distributed paging systems utilize a group of individual speakers that are distributed throughout an area or facility that are connected together electrically for the purpose of delivering paging announcements, background music or other information throughout the area or facility. The two types of distributed paging systems primarily in use today are centrally amplified and self-amplified systems.

Centrally amplified paging systems use amplifiers with maximum output levels typically limited to the range of 25 to 100 Vrms. Centrally amplified paging systems typically use passive speakers with locally mounted transformers that step down the maximum output levels from the central amplifier to levels more compatible with the passive speakers. Centrally amplified paging systems allow many passive speakers to be connected in parallel without the need to make complicated calculations or connect the passive speakers in ways that would overload the central amplifiers. However, system expansion in small power increments is difficult to achieve since central amplifiers have fixed maximum power outputs. The need to exceed the maximum load capability of a centralized amplifier will require equipment replacement with a higher-powered amplifier model. This causes additional system expense and the next higher power level may be significantly more than necessary which adds unnecessary cost to the paging system.

Self-amplified paging systems do not use central amplifiers. In a self-amplified paging system, each speaker has a local amplifier built into its enclosure. These amplifiers have traditionally been based on analog designs. A plurality of self-amplified speakers are connected to a remote power supply that is capable of powering the plurality of speakers. Typically, it is relatively simple to connect a large number of speakers in parallel in a self-amplified speaker system to a remote power supply. The total power of the paging system can be finely scaled with no unnecessary system power left in reserve as sometimes happens with central amplifier systems.

Self-amplified speaker system typically uses four conductors: (1) two conductors to carry power from the remote power supply to the amplifier; and (2) two conductors to carry the audio signal to the input of the amplifier. Typically, the remote power supply for a self-amplified speaker system is 24 VDC and the audio signal voltage level is comparable to that of a conventional analog telephone system. However, the voltage drop in the two conductors that connect to the remote power supply for a self-amplified speaker system can be a problem with background art self-amplified systems. The maximum distance between the power supply and the self-amplified system is limited by the combination of the gauge of wire used (i.e., due to its associated resistance) and the typical current requirements of the local amplifier.

In addition, background art implementations of self-amplified power amplifiers typically use linear Class A or Class AB type power amplifier topologies. Both class A and Class AB power amplifiers utilize a pair of output transistors to produce a power amplified output signal from the input signal. In Class A amplifiers, both output transistors are continuously conducting or "on" throughout the entire input signal cycle. The Class A configuration produces a very linear output, provides the least distortion of the input signal but typically can only provide an average electrical efficiency of 20%. The average electrical efficiency of a device can be characterized in terms of the ratio of output power produced-to-input power required by the device or system.

In Class AB amplifiers, both output transistors conduct for more than half but less than the entire input signal cycle. Efficiencies of about 50% are possible with the Class AB power amplifier configuration. However, as further discussed below, disadvantages to the use of these types of analog power amplifier configurations include: (1) relatively poor average electrical efficiency; (2) large input power supply requirements; (3) excessive heat generation and (4) physically large hardware implementations.

When used to amplify musical and voice programming, the average electrical efficiency of Class A and Class AB power amplifier configurations typical of background art self-amplified power amplifiers is only around 30%. As a result, for musical and voice programming applications, 70% of the input power is being wasted and results in excessive heat generation by the device or system.

In low output power applications (e.g., below 5 Watts), the relatively low average electrical efficiency of the Class A and Class AB amplifiers discussed above is not problematic. However, at higher levels of output power the background art self-amplified speaker apparatus or systems require a large amount of input power supply current to produce the required output power. Thus, the low average electrical efficiency of Class A and Class AB power amplifiers is a disadvantage when, as in musical and voice programming applications, large amounts of input power are required to produce a desired level of output power.

In addition, to support the large input power supply requirements, Class A and Class AB power amplifiers may also require a larger gauge power supply wiring. Typically, Class A and Class AB amplifier circuits require a minimum of 15 VDC to operate properly. For a given gauge of power supply wiring, the length of the wire between the power supply and the amplifier/speaker apparatus must be restricted in order to limit resistive power loss to an acceptable level above 15 VDC. That is, due to resistive power loss, the terminal voltage can drop below the 15 VDC level and, as a result, the apparatus or system will shut down and produce no output power. Even if the speaker device or system does not completely shut down due to these resistive losses, the acoustical output from the speaker may be highly distorted and unintelligible.

In addition, many paging systems cover large areas and the distances between adjacent speaker/amplifier apparatus and from the apparatus to the remote power supply can require large distances of interconnecting cable. If the lengths of the cable connecting the apparatus and its associated power supply are very limited in length in comparison to the total linear distance of cable required to connect all apparatus, then more power supplies must be installed. Additionally the acceptable location of these additional power supplies becomes somewhat specific due to the length limitation and the required locations may not be suitable for power supply installation because of its lack of AC power receptacles, lack of suitable mounting surfaces or exposure to damage or tampering. Making an area suitable for mounting a power supply can be costly, inconvenient and time consuming. Therefore, a system that allows significantly longer cable lengths while performing as well or better than the current art mitigates many of these problems is economically valuable to the owner of the system.

Another disadvantage to the use of prior art Class A and Class AB amplifiers is a limitation on the system amplifier power output rating. Because of the high current consumption of linear power amplifiers, it is impractical to create remotely powered loudspeaker systems that have in excess of 30 watts maximum power output to the internal speaker. In the past manufacturers have tried to remedy this problem by running the system on 48 VDC to halve the required current in an effort to reduce the required interconnecting wire gauge between the remote power supply and the speaker system and keep the wire lengths to usable run lengths. Obviously this creates other problems as some of the system may be run on 24 VDC and cannot share the same power supply and power supply wiring for existing units, which complicates system expansion and coverage. Also the higher-powered systems over 30 watts output could not practically dissipate the heat required from a physical size standpoint and fit inside the speaker system package. This limitation is removed from the switching amplifier approach by its 2 times average efficiency advantage.

Further, increases in the ambient temperature in the device or system due to the heat generated by Class A and Class AB amplifiers can require the use of larger heat sinks to keep operating temperatures at a safe level that ensures proper circuit operation. Of course, larger heat sinks have the disadvantage of increasing the weight, cost and physical size of the self-amplified power amplifier apparatus or system. In consideration of the disadvantages of background art Class A and Class AB amplifiers discussed above, there is a need in the art of self-amplified power amplifiers to improve average electrical efficiency and reduce input power supply requirements, heat generation and physical size.

Furthermore, many paging systems are installed out of doors and as such must be weatherproof. In weatherproof reentrant horn loudspeakers the enclosure encasing the class D amplifier will be completely sealed to prevent water infiltration and as such no cooling ventilation of the amplifier enclosure is possible. This lack of ventilation accelerates the ambient temperature rises within the enclosure when a class A or AB amplifier is used. Additionally, the material that forms the enclosure is often a non-thermally conducting material like plastic providing no means of radiating the built up heat from the enclosed space. The heat build up can cause overheating and in response the amplifier may protect itself by ceasing operation temporarily, interrupting the operation of the paging system or the amplifier may complete fail. These conditions can present themselves even at low to moderate continuous output power levels, like those used for low volume background music in a paging system. This is especially true in ambient environments subject to high temperatures like those found outdoors in the all parts of the country during the summer, or where the speaker/amplifier apparatus is subject to direct sunlight.

BRIEF SUMMARY OF THE INVENTION

The present invention utilizes switching power amplifier technology to improve the performance of self-amplified speaker apparatus or systems. In contrast to analog Class A and Class AB amplifiers, the present invention utilizes a digital class D amplifier. Class D amplifiers are a pulse width modulated or digital switching amplifier configuration. In Class D amplifiers, either the output transistor is either fully on or fully off, significantly reducing the power losses in the output transistors. Class D amplifiers have an average electrical efficiency value of at least 60%. This also leads to reduction in the amount of power lost in the device or system that results in heat generation. More specifically, the present invention utilizes Class D and other switching power amplifier topologies to increase electrical efficiency; and reduce power supply requirements, heat generation and physical size of self-amplified speaker apparatus and systems.

The present invention employs a miniature switching power amplifier in the self-amplified speaker that reduces DC power consumption/current requirements up to as little as 12 that of typical analog-bases power amplifier devices operating under the same conditions. Thus, the system and apparatus of the present invention can allow up to twice the cable length between the amplifier/speaker systems or support twice the number of amplifiers/speaker systems as compared to analog-based designs of the background art.

The present invention uses a filter-less class D switching power amplifier that can double the average electrical efficiency of background art Class A and Class AB power amplifiers. In addition, the present invention has enhanced reliability due to reduced heat generation; lower cost, compact size and the ability to operate in ambient temperatures above 40° C. Further, the present invention has been tested using a centralized 24 VDC power supply and may used with a wide range of both DC and AC power supply voltages. Preferably, DC power supply voltages are in the range from 12 to 30 volts. Though AC power supply voltages need not be regulated they should at least be rectified and filtered. Preferably AC power supply voltages will be within a range that yields a 12-30 VDC output when rectified. Furthermore, the present invention is applicable to various loudspeaker apparatus and systems that include, but are not limited to, direct radiator and distributed mode technologies.

One embodiment of the present invention is a switching power amplifier apparatus, comprising: a power supply; an input transformer; a variable gain amplifier; dual comparators and output drivers; an amplitude scaling triangle waveform generator; a switching power amplifier; and a 2-pole compensated error amplifier with negative feedback from the switching power amplifier. In this embodiment an audio signal may be coupled to inputs of the input transformer; outputs of the input transformer are coupled to inputs of the variable gain amplifier; the output of the variable gain amplifier is coupled to an input of the 2-pole compensated error amplifier; the error amplifier is driven by the switching power amplifier output stage; the variable gain amplifier is connected to the power supply; the variable gain amplifier is connected to the power supply; an in-phase version of the error amplifier output is coupled a first input of a first comparator of the dual comparators; an anti-phase version of the error amplifier output is coupled to a first input of a second comparator of the dual comparators; the amplitude scaling triangle waveform generator is connected to the power supply; a triangle waveform from the amplitude scaling triangle waveform generator is coupled to second inputs of the first comparator and the second comparator; outputs of the dual comparator are coupled to the output drivers, each of which provides complimentary digital outputs; and the complimentary digital outputs are coupled to inputs of the switching power amplifier.

Another embodiment of the present invention is an integrated, self-amplified speaker system comprising: the switching power amplifier apparatus discussed above and a speaker, wherein outputs of the switching power amplifier are coupled to a compression driver of the speaker.

Yet another embodiment of the invention is a speaker system comprising a plurality of self-amplified speakers, each with a class D amplifier, connected to a remote power supply by a cable using a range of commercial wire gauges, wherein a maximum cable length between a self-amplified speaker and the remote power supply is greater than 1850 feet. Preferably, the class D switching power amplifiers of this embodiment further comprise an amplitude scaling triangle waveform generator and 2-pole negative feedback compensation. Preferably, the speaker system of this embodiment has a cable that uses a wire gauge of 16. More preferably, the cable length of this embodiment has a wire gauge of 24 in most practical system configurations. More preferably, the range of values of commercial wire gauges for this embodiment further comprise 26, 24, 22, 20 and 18; and the maximum cable lengths for this embodiment further comprise lengths greater than 200, 300, 450, 750 and 1250, respectively.

Another embodiment of the invention is a speaker system comprising a plurality of self-amplified speakers, each with a class D amplifier, connected to a remote power supply by a cable using a range of values commercial wire gauges, wherein the range of values of commercial wire gauges use in the cable are 26, 24, 22, 20 and 18; and the maximum cable length between a self-amplified speaker and the remote power supply are greater than 200, 300, 450, 750 and 1250 feet, respectively.

Another embodiment of the present invention is An integrated, self-amplified speaker system comprising: at least one remote power supply and filtering stage; an input transformer; a variable gain amplifier; dual comparators and output drivers; a triangle waveform generator; a switching power amplifier, a 2-pole compensated error amplifier with negative feedback from the switching power amplifier, and a constant directivity re-entrant horn speaker. In this embodiment an audio signal may be coupled to inputs of the input transformer; outputs of the input transformer are coupled to inputs of the variable gain amplifier; the output of the variable gain amplifier is coupled to an input of the 2-pole compensated error amplifier; the error amplifier is driven by the switching power amplifier output stage; an in-phase version of the error amplifier output is coupled a first input of a first comparator of the dual comparators; an anti-phase version of the error amplifier output is coupled to a first input of a second comparator of the dual comparators; the triangle waveform generator is connected to the power supply; a triangle waveform from the triangle waveform generator is coupled to second inputs of the first comparator and the second comparator; outputs of the dual comparator are coupled to the output drivers, each of which provides complimentary digital outputs; the complimentary digital outputs are coupled to inputs of the switching power amplifier; and outputs of the switching power amplifier are coupled to a compression driver of the constant directivity re-entrant horn.

Preferably, in the present invention balanced inputs can be transformer coupled or electronically balanced. The inputs of the present invention are not limited to transformers only, because both topologies could be employed. The inputs of the present invention may also be single ended.

Preferably, the present invention may use different horn speaker topologies such as a re-entrant horn with no constant directivity flair. Preferably, the present invention may use other high efficiency and switching amplifier topologies such as: output filter-less closed loop bridged topologies without a scaling triangle generator or 2-pole compensation or any combination of these features. Preferably, the present invention may use output filter-less or filtered closed loop bridged topologies that are self oscillating; output filtered closed loop full bridged or half-bridged circuit topologies; different output filtered modulation schemes such as Class T or Class I. Further, the present invention is not limited to these modulation schemes. Preferably, the present invention may also use open loop bridged analog and or digital switching topologies that do not use analog feedback and or use predictive switching techniques.

DETAILED DESCRIPTION OF PREFERRED EMBODIMENTS

Figure 1:
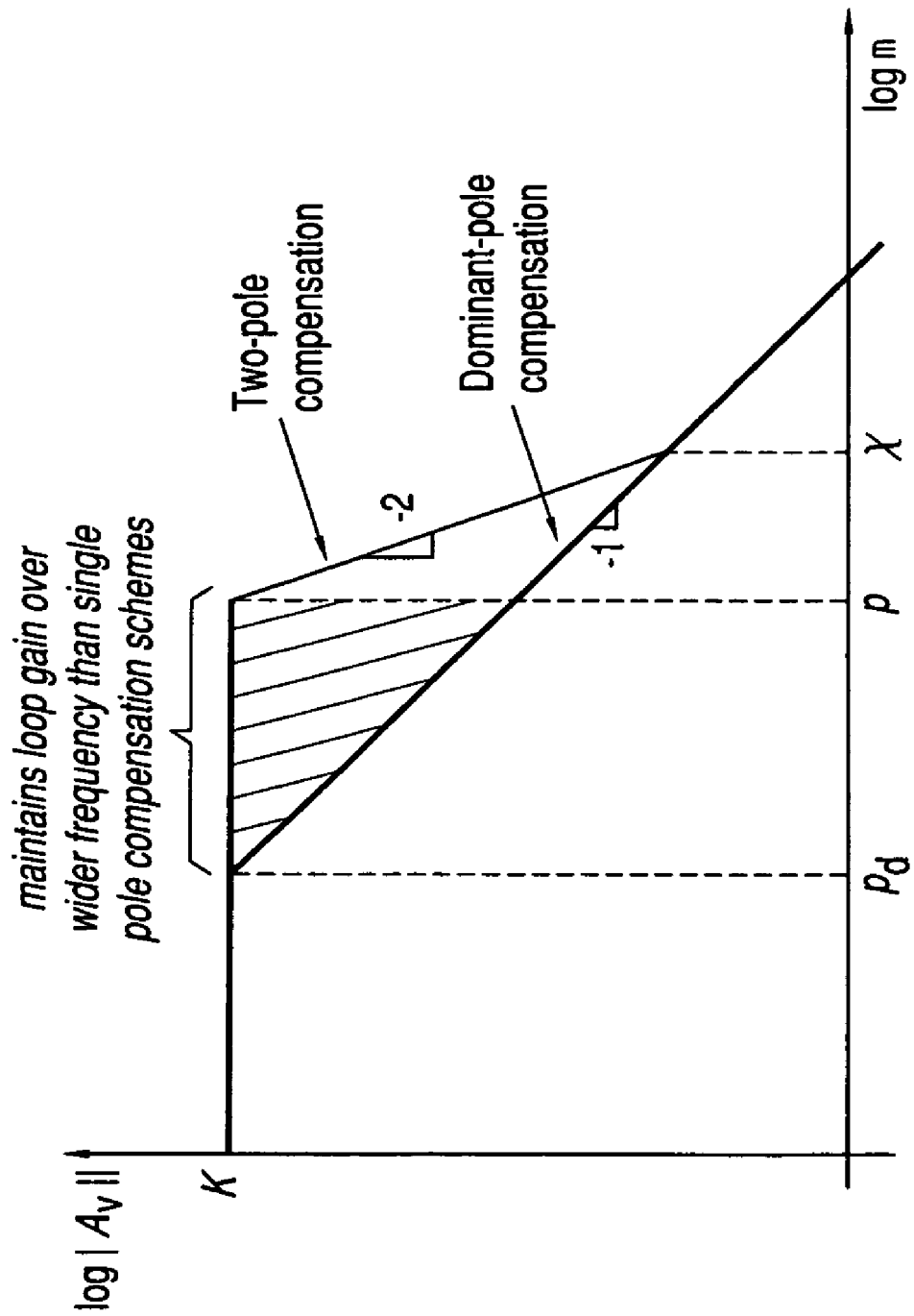
FIG. 1 illustrates the Bode plot of a two-pole compensator.

The present invention uses a digital switching power amplifier configuration as opposed to the analog amplifier configurations of the Class A and Class AB amplifiers of the background art. In particular, due to the use of a digital Class D switching power amplifier, many of the disadvantages of the background art Class A and Class AB amplifiers discussed above can be eliminated or minimized. The switching amplifier design of the present invention has an average electrical efficiency of over 65%. This efficiency is more than double that of Class A and Class AB amplifiers for music and voice applications.

In addition, due to the increased average electrical efficiency of the present invention, the power supply current requirements are at least halved relative to the background art. Further, as a result of the reduced power supply current requirements, a smaller diameter conductor power supply wiring can be used as compared to the background art and can provide acceptable signal levels despite resistive losses for a given wire length/gauge. The use of smaller diameter conductor power supply wiring results in reduced cost and reduced concern about resistive loss such that the loudspeaker apparatus or system of the present invention may be located further away from the power supply than background art implementations.

Further, the reduction in power supply requirements discussed above leads to reduced heat generation in the apparatus or system of the present invention, as compared to the background art. As a result, the present invention has reductions in cost, heat sink requirements and physical size, as compared to the background art. Further, due to the reduced heat generation, there is an improvement in the reliability of the apparatus or system of the present invention in terms of Mean Time Between Failure (MTBF).

Further, the reduced heat generation allows for the possibility of even more continuous operation of the apparatus or system and a higher value of average power output that can be useful in overcoming high ambient noise environments. For example, fewer self-amplified speaker systems may be used to maintain intelligible communication as compared to background art technologies. As another example, lower heat generation would be an obvious benefit in installations where there might be continuous music or paging, hot factories or outdoors use where the unit might be exposed to bright sunlight.

Further, due to the increased average electrical efficiency, the present invention requires less heat sinking and allows the present invention to fit into many package volumes and shapes that could not be implemented with the background art. Further, as a result of the increased average electrical efficiency, the present invention is capable of more compact packaging and lighter weight for a given electrical output power.

Furthermore, when used in a preferred embodiment as an all-weather reentrant horn loudspeaker, the enclosure encasing the class D amplifier will be completely sealed to prevent water infiltration and as such no cooling ventilation of the amplifier enclosure is possible. This lack of ventilation accelerates the ambient temperature rises within the enclosure when a class A or AB amplifier is used. Additionally, the material that forms the enclosure is often a non-thermally conducting material like plastics providing no means of radiating the built up heat from the enclosed space. The heat build up can cause overheating and in response the amplifier may protect itself by ceasing operation temporarily, interrupting the operation of the paging system or the amplifier may complete fail. These conditions can present themselves even at low to moderate continuous output power levels, like those used for low volume background music in a paging system. This is especially true in ambient environments subject to high temperatures like those found outdoors in the all parts of the country during the summer, or where the speaker/amplifier apparatus is subject to direct sunlight.

Moreover, embodiments of the present invention feature an automatic amplitude scaling triangle waveform generator that tracks proportional changes in the incoming power supply. Providing this tracking capability in the amplitude scaling triangle waveform generator forces a constant ratio between the power supply voltage and the comparator voltage switching levels. For example, if the power supply voltage varies over a 2-to-1 ratio, the comparator voltage switching levels will effectively vary by the same amount. Maintaining this constant ratio enables the switching power amplifier to maintain a constant open loop gain. Since the switching power amplifier of the present invention maintains a constant open loop gain with variations in the power supply voltage, the present invention has better closed loop electrical stability and is less likely to oscillate than background art class D amplifier schemes.

In addition, due to the switching power amplifier maintaining a constant open loop gain, the present invention is able to use a 2-pole compensation scheme. The 2-pole compensation scheme features a gain (K) vs. frequency characteristic as shown in FIG. 1. This type of gain vs. frequency characteristic has the advantages of:

(1) providing additional in-band loop gain; and
(2) allowing more negative feedback to be used, as compared to background art 1-pole compensation schemes.

Due to the above discussed design features, the present invention provides less total harmonic distortion (THD) for the closed loop switching power amplifier output than class D amplifiers of the background art. In addition, due to the above discussed advantages of the present invention over the background art, self-amplified switching power amplifier apparatus or systems can produce higher power output in smaller and more practical packages and provide for new designs with even higher output are possible as compared to those of the background art.

Figure 2:
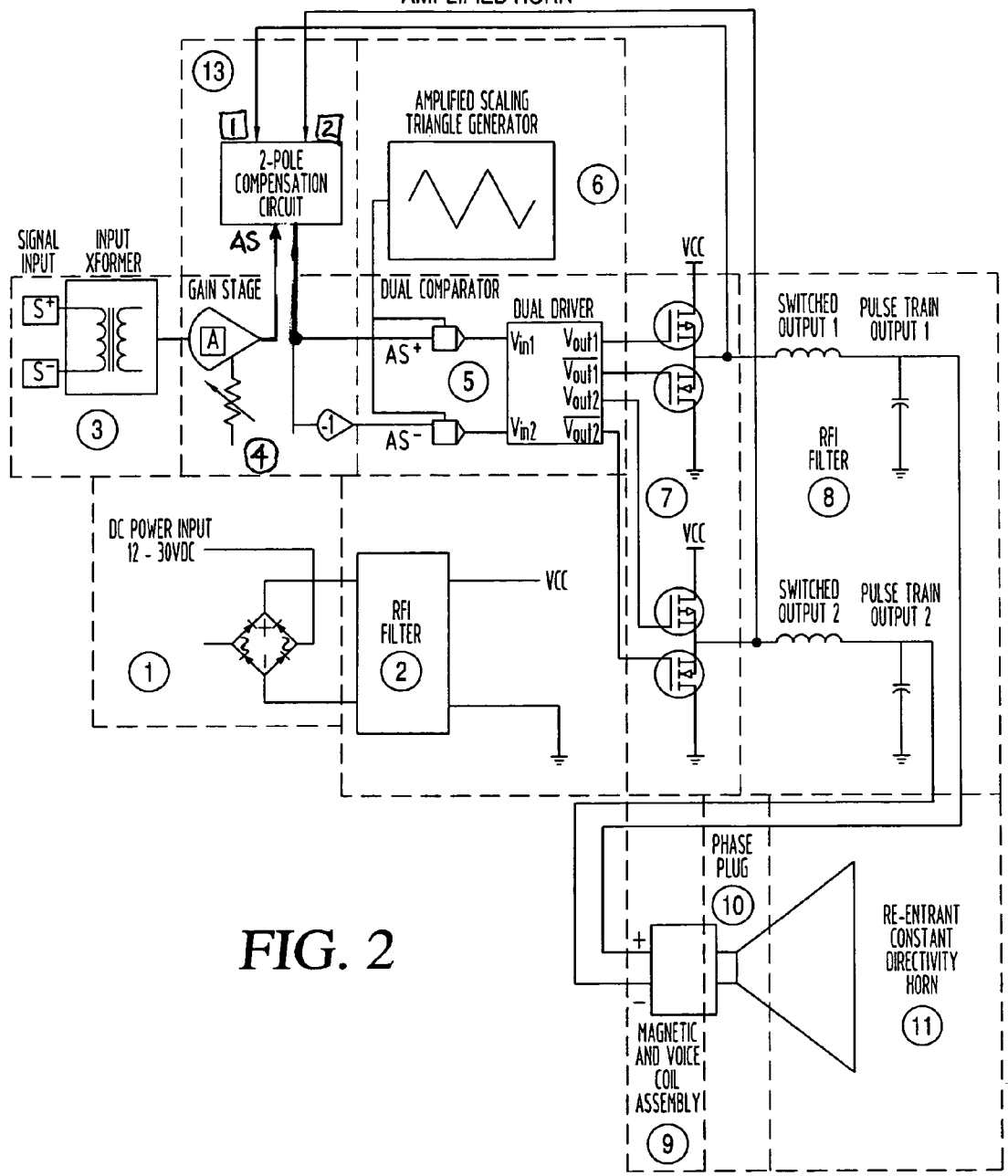
FIG. 2 illustrates a block diagram for a self-amplified switching power amplified system of the present invention.

FIG. 2 illustrates a block diagram for a self-amplified switching power amplified system of embodiment of the present invention. In particular, FIG. 2 illustrates a filterless switching power amplifier apparatus that receives a 12V to 30V DC power supply input $V^+$, $V^-$. Alternatively, an AC power supply input signal $A^+$, $A^-$ may be applied to the full-wave rectifier bridge 1. Either the DC or AC power supply input signal passes through a full-wave rectifier bridge 1 that makes the power supply input connection polarity insensitive. The output of the full-wave rectifier bridge 1 is coupled to a radio frequency interference (RFI) filter 2 that filters the power supply input to produce the direct current power supply feed lines (VCC, GND) that provides the voltage that operates the circuits of the apparatus or system. Moreover, the RFI filter 2 prevents any switching noise from coupling into the power supply feed lines.

An audio signal input $S^+$, $S^-$ passes through an audio signal transformer 3 that accepts both balanced and unbalanced audio signals. The amplitude of the audio signal input $S^+$, $S^-$ is then amplified and the frequency response is equalized by a variable amplifier gain stage 4. The variable gain amplifier contains equalization that is complementary to the acoustical frequency response of the horn loudspeaker. The equalization of the variable gain amplifier is intended to flatten out the overall frequency response of the entire amplifier-loudspeaker system.

Figure 8:
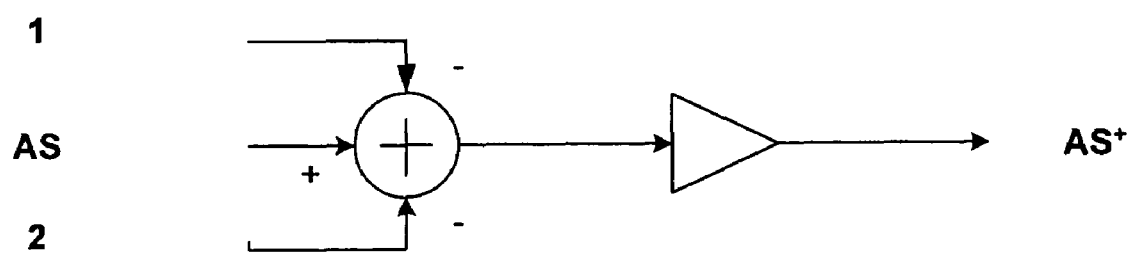
FIG. 8 illustrates a block diagram of the 2-pole compensation circuit.

An error amplifier stage 13, included in the feedback loop of the power amplifier 27, provides 2-pole compensation that enables more closed-loop feedback and lower total harmonic distortion. A block diagram of the 2-pole compensation circuit is shown in FIG. 8. The amplified analog signal input $AS^+$ is then coupled to the inputs stages of dual comparator device 5 that compares anti-phase versions $AS^+$, $AS^-$ of the amplified audio signal input to a reference triangle waveform T from a triangle waveform generator 6 at the input to the comparator 5. The anti-phase or inversion of $AS^-$ of the in-phase version of the amplified audio signal input $AS^+$ is provided by feeding $AS^+$ through an inverting amplifier associated with the variable gain amplifier stage 4. If either the in-phase or anti-phase versions of the amplified audio signal input $AS^+$ are higher than the reference triangle waveform T on the comparator 5, a positive pulse is output for that phase. The converse is true if either in-phase of anti-phase version of the amplified audio signal input $AS^+$ is lower than the reference triangular waveform T.

Constant open loop gain is maintained by scaling the amplitude output of the reference triangle generator 6 to the input power supply voltage. Preferably, there is a scaled input directly tied from the power supply to the triangle generator. In addition, as discussed above, the reference triangle generator 6 maintains constant loop gain for improved closed-loop stability.

The output of the dual comparator device 5 is then fed to the dual driver circuit 13 that provides complimentary digital outputs (e.g., $V^+_{out1}$, $V^-_{out1}$) for the dual comparator device 5. These complimentary digital outputs $V^+_{out1}$, $V^-_{out1}$ provide a pulse train that represents a sampled, Pulse Width Modulated (PWM) version of the amplified input audio signal $AS^+$. These complimentary digital outputs provide the switching control waveform for the Class D switching power amplifier output stage 7 that forms two independent half bridges. This switching power amplifier stage 7 switches the power output to the speaker 11.

As the amplified input audio signal AS⁺ goes more positive, the positive half bridge's pulses become wider and the negative half become narrower. As the amplified input audio signal AS⁺ goes more negative, the negative half bridge's pulses become wider and the positive half become narrower. The net switching power amplifier stage output signal to the load is the difference between the two independent half-bridge outputs.

Figure 3:
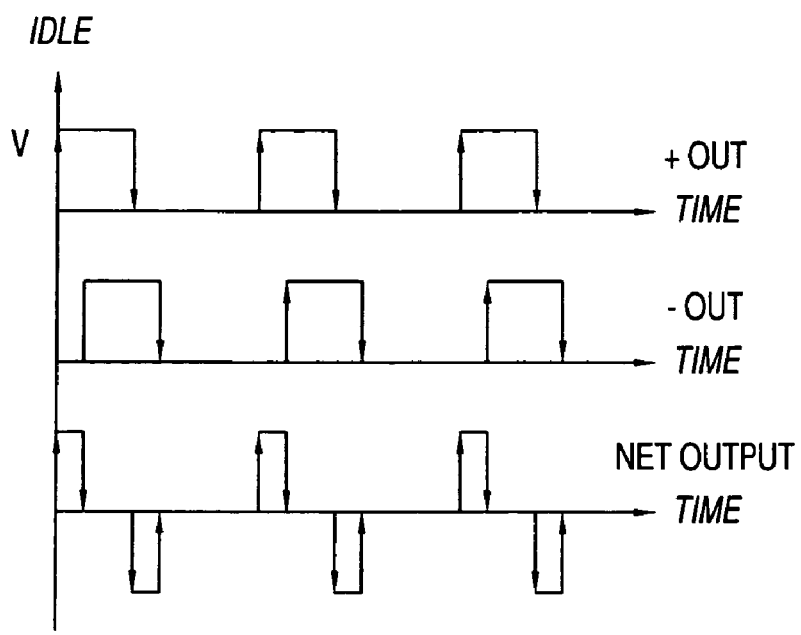
FIG. 3 illustrates the output waveforms of the switching power amplifier stage when the inputs are idle.
Figure 4:
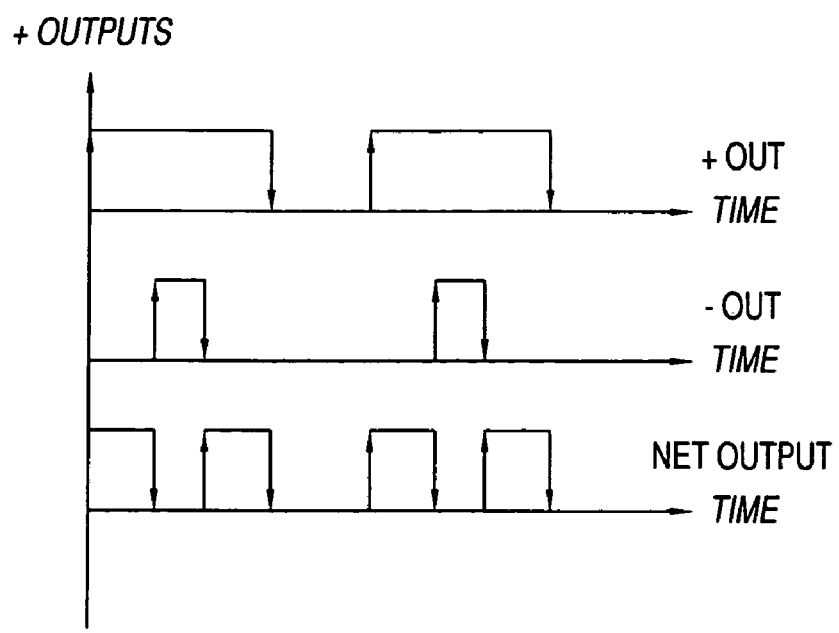
FIG. 4 illustrates the output waveforms of the switching power amplifier stage when the inputs are active.

FIG. 3 and FIG. 4 illustrate the output waveforms of the switching power amplifier stage 7. In particular, the two independent half-bridge outputs of the switching power amplifier stage 7 are in phase at idle, as shown in FIG. 3. Consequently, there is near zero net output under idle signal conditions. This removes the necessity of employing an audio frequency output filter after the power amplifier that is a requirement in background art power amplifier designs. In contrast to the background art, in the present invention, there are two radio frequency filters 8 on the outputs of the switching power amplifier, as shown in FIG. 2. These filters are low pass filters (LPFs) that remove the fast rising edges of the output pulses and further reduce any potential RFI. However, these LPFs are optional and are not required for proper operation of the present invention. FIG. 4 shows the two independent half-bridge output waveforms of the switching power amplifier output stage 7 when the signal is not idle.

Figure 5:
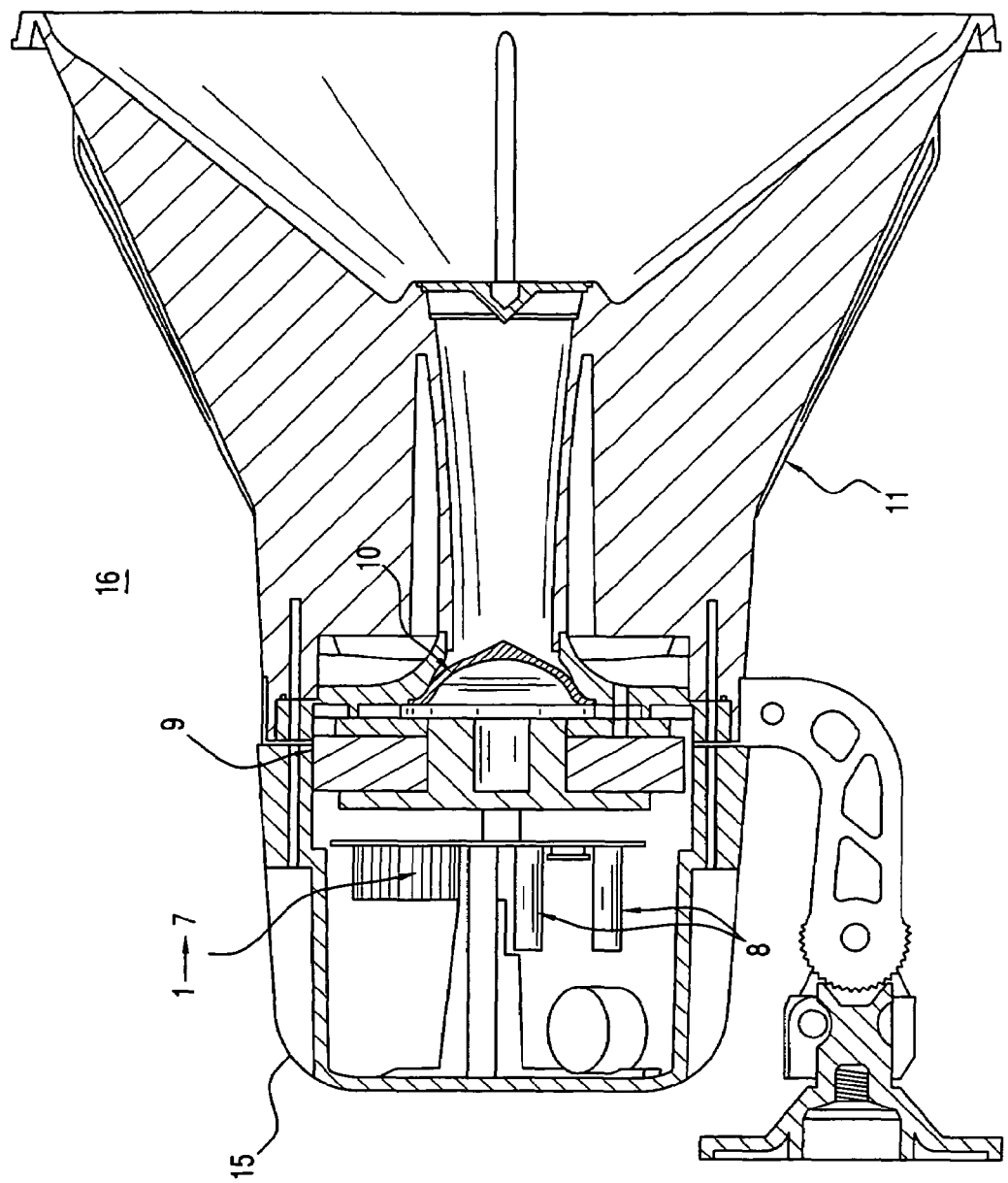
FIG. 5 illustrates a cut-away view of the system of the present invention.

FIG. 5 illustrates a cut-away view of an exemplary integrated, self-amplified speaker system of the present invention. As an example of the present invention, a self-amplified switching horn using a constant directivity re-entrant horn 11 loudspeaker and a Class D switching power amplifier was developed. The apparatus or system of the invention uses a filterless Class D switching power amplifier and was designed to be weatherproof for indoor or outdoor application. However, no other restrictions were made to other possible switching power amplifier topologies that may be used with the present invention.

The exemplary integrated, self-amplified speaker system 16 of the present invention is shown in FIG. 5 and includes at least three subsystems: (1) a filterless switching power amplifier apparatus 1-8; (2) a front loaded compression driver 9 and ring-shaped phase plug 10; and (3) a constant directivity re-entrant acoustical impedance transformer (e.g., horn 11). Both the switching power amplifier apparatus 1-8 and the compression driver 9 are housed in a sealed plastic end bell 15 that encloses the back of the integrated, self-amplified speaker system 16 shown in FIG. 5. The plastic end bell 15 is sealed and isolated from the external environment.

As discussed above, the switching power amplifier 7 outputs are optionally filtered and then fed directly to a front loaded compression driver 9, as shown in FIG. 5. The compression driver 9 is further comprised of a permanent magnet and a coil that is attached to a dome shaped vibrating phenolic diaphragm. The vibrating phenolic diaphragm integrates and converts the pulse train output from the switching power amplifier into a recognizable continuous acoustical output. The acoustical output is then fed through a front-loading ring shaped phase plug 10 that improves the sensitivity of the compression driver 9 and provided the desired frequency response from the constant directivity re-entrant horn 11. From there, the acoustical waves enter the throat of the re-entrant horn 11 and initially expand at an exponential rate through the first two sections of the flare of the re-entrant horn 11.

Acoustical waves can then expand through a rectangular conical section of the outer bell of the re-entrant horn 11 shown in FIG. 5. In addition, at the end of the outer bell of the re-entrant horn 11, the acoustical waves expand into the free atmosphere with their radiation normal to the walls of the outer horn bell at all frequencies above the critical frequency for constant directivity operation. This is based upon the linear dimensions of the mouth of the re-entrant horn 11. Preferably, the linear dimensions of the horn bell sides are inversely proportional to the frequency at which the directivity is controlled by a linear proportionality constant. More preferably, as the dimensions of the horn become larger, the lowest frequency to which the directivity is controlled becomes lower by the same amount. As a non-limiting example, if the horn dimensions can become twice as long, the frequency control is extended to roughly one half the frequency.

In addition, the structure of the re-entrant horn 11 is laterally braced to prevent vibration and consequent frequency response variations caused by the flexing of the walls of the bell of re-entrant horn 11. Based upon measurements and comparisons to background art implementations, the system of the present invention has more than twice the efficiency of conversion from electrical to acoustical energy into the listening space. Under nominal operating conditions the switching power amplifier operated at a 20° C. rise in temperature over ambient conditions. This extrapolates to a maximum operating ambient temperature of at least 50° C.

Figure 6:
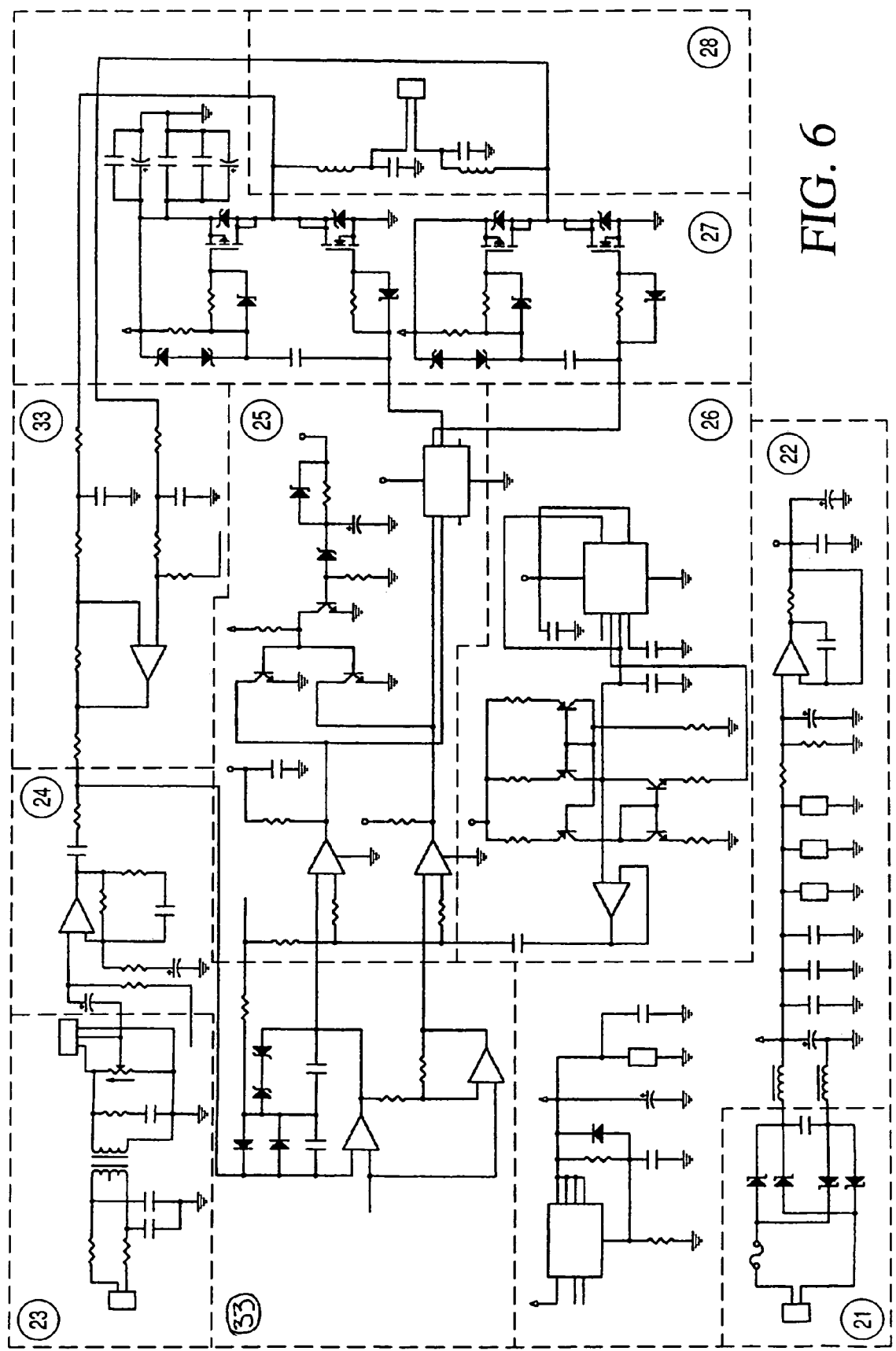
FIG. 6 illustrates a detailed schematic diagram of the apparatus of the present invention.

FIG. 6 illustrates a detailed schematic diagram of the apparatus of the present invention. In particular, FIG. 6 shows an exemplary schematic diagram for a switching power amplifier apparatus. The switching power amplifier comprising: a power supply and filtering 21, 22; an input transformer 23; a variable gain amplifier 24; a 2-pole compensated error amplifier 33; dual comparators and output drivers 25; an amplitude scaling triangle waveform generator 26 that tracks changes in the power supply; and a switching power amplifier 27. Optionally, output filtering 28 may be also be included with the switching power amplifier apparatus of the present invention.

In addition, as shown in FIG. 6, the input transformer 23 couples an audio signal to the variable gain amplifier section 24. A full-wave rectifier section 21 is coupled to a power supply filtering section 22 that further couples the filtered power supply signal feed lines to the remaining circuits of the apparatus. A first comparator input 25-1 compares an in-phase version of the amplified audio input signal from the 2-pole compensated error amplifier section 33 to a triangle wave from the amplitude scaling triangle waveform generator 26. A second comparator input 25-2 compares an anti-phase version of the amplified audio input signal from the 2-pole compensated error amplifier 33 to the triangle wave from the amplitude scaling triangle waveform generator 26. The dual output drivers are coupled to the outputs of the dual comparator 25 and provide complimentary digital outputs from each of the dual comparator 25 to the input of the switching power amplifier output stage 27. The outputs of the switching power amplifier section 27 are one of coupled to a power amplifier filtering stage 28 or provided as a directly coupled output for the loudspeaker (not shown).

In addition, the switching power amplifier includes 2-pole feedback compensation. Further, the switching power amplifier apparatus discussed above preferably includes power supply and filtering that comprises: a full-wave bridge; and a radio frequency interference filter. In the switching amplifier of the present invention a positive voltage input and a negative voltage input are coupled to a positive input and a negative input, respectively, of the full-wave bridge; a positive output and a negative output of the full-wave bridge are coupled to inputs of the radio frequency interference filter; and outputs of the radio frequency filter provide power supply voltages to the switching power amplifier apparatus.

Further, in the integrated, self-amplified speaker system shown in FIG. 2, either the outputs of the switching power amplifier are direct coupled outputs or coupled to a power amplifier filtering stage 28 and then coupled to inputs of a compression driver of a speaker. Furthermore, the switching power amplifier apparatus, wherein the switching power amplifier includes class D amplifiers, is further configured to provide an average electrical efficiency of greater than 65%.

Moreover, another embodiment of the present invention is an integrated, self-amplified speaker system comprises the switching power amplifier apparatus discussed above and a speaker, wherein outputs of the switching power amplifier are coupled to a compression driver of the speaker. In addition, the compression driver may be coupled to a phase plug that provides an amplified output signal to a diaphragm of a re-entrant horn. Further, the compression driver further comprises: a magnet; a coil; and a diaphragm.

Further, in the integrated, self-amplified speaker system of the present invention, the outputs of the switching power amplifier are coupled to the input terminals of the compression driver; the coil is attached to input terminals of the compression driver; the magnet and the coil convert an electric field of the outputs of the switching amplifier into a magnetic field; and the diaphragm integrates the magnetic field into an acoustical output that drives the speaker.

Further, in the integrated, self-amplified speaker system, preferably the compression driver further comprises a phase plug configured to improve the sensitivity of the compression driver. Further, preferably the speaker is a constant directivity re-entrant horn.

Further, in the integrated, self-amplified speaker system of the present invention, preferably the power supply and filtering, input transformer, audio signal input, variable gain amplifier, dual comparator and dual output driver, amplitude scaling triangle waveform generator, switching power amplifier section, and a switching power amplifier are enclosed in a sealed plastic end bell attached to the constant directivity re-entrant horn of the speaker.

Further, in the integrated, self-amplified speaker system of the present invention, preferably the constant directivity re-entrant horn of the speaker further comprises a rectangular conical section located at the distal end of the constant directivity re-entrant horn. In addition, preferably, the constant directivity re-entrant horn of the speaker further comprises structural braces configured to prevent vibration.

Further, in the integrated, self-amplified speaker system of the present invention, preferably, the diaphragm is dome shaped and/or the diaphragm is a movable phenolic diaphragm. Furthermore, in the integrated, self-amplified speaker system, preferably the phase plug is front loading and/or the phase plug is ring-shaped.

As previously discussed, the cable lengths that connect self-amplified speaker systems an associated remote power supply can be problematic. This is due to the resistance of the wires that are used to make up the cables. Table 1 below gives examples of typical resistance per foot for a range of wire gauges used in cables typically used in copper cables for self-amplified speaker systems.

TABLE 1

Resistance/foot vs. Wire Gauge for typical Speaker Systems employing copper cables

| Gauge | Ohms/ft |
|---|---|
| 16 ga | 0.00402 |
| 18 ga | 0.00637 |
| 20 ga | 0.01015 |
| 22 ga | 0.01615 |
| 24 ga | 0.02566 |
| 26 ga | 0.04084 |

As current flows down these resistive cable lengths, a voltage drop occurs. The voltage drop is equal to the conductor resistance (ohms) multiplied by the current flowing through the cable. The cable contains both a feed and a return conductor. The circuit loop that the current must flow through is therefore twice as long as the cable length. This total conductor length multiplied by the conductor's resistance per unit length results in the total resistance the current will flow through. The terminal voltage that is received at the self-amplified speaker system is equal to the value of the remote power supply voltage minus this voltage drop. The power amplifier within the self-amplified speaker system clearly has a power supply voltage below which the performance of the power amplifier will degrades and ultimately, below which the power amplifier cannot function. Thus, the maximum cable length from the remote power supply that permits proper operation of a self-amplified speaker system is a key parameter to consider in performance comparisons.

Laboratory test of the performance of the present invention versus background art amplifier components were used to verify the performance gains with the apparatus and system of the present invention. In particular, the results that are shown in Table 2 below.

TABLE 2

Performance Comparison of Present Invention vs. Background Art

| Amplifier Device | Device Current Draw (Amps)** | Maximum Allowable Supply Cable Length (Feet)*** Wire Gage (AWG) | | | | | |
|---|---|---|---|---|---|---|---|
| | | 26 | 24 | 22 | 20 | 18 | 16 |
| 15 W Class D* | 0.45 | 245 | 390 | 619 | 985 | 1570 | 2485 |
| 15 W Class AB | 0.90 | 122 | 195 | 310 | 493 | 785 | 1243 |

*Class D amplifier topology of the present invention.
**Current drawn with output power to load of 7.4 Wrms
***Corresponds to loop voltage drop of 9 V The test data of Table 2 compares the performance of a 15-Watt power amplifier device using the Class D switching power amplifier apparatus of the present invention as compared to a standard 15-Watt Class AB amplifier. Tests were performed to determine the maximum allowable voltage drop before noticeable changes in distortion when each device was producing 7.4 watts of output power. The resistance per foot values for various gages of wire were used to calculate the distance of wire that would cause a 9V drop in supply voltage at the amplified speaker device. As can be seen from Table 2, at each gauge of wire over the range tested, the Class D amplifier device of the present invention enjoyed approximately a 2:1 advantage, in terms of device current draw and maximum allowable supply cable length, over the Class AB amplifier typical of the background art. As a result of this advantage, self-amplified systems of the present invention also enjoy a 2:1 advantage in terms of maximum cable length (i.e., maximum distance from the remote power supply), and in the number of amplifiers that can be supported by the system. This comparison is illustrated graphically in FIG. 7.

Figure 7:
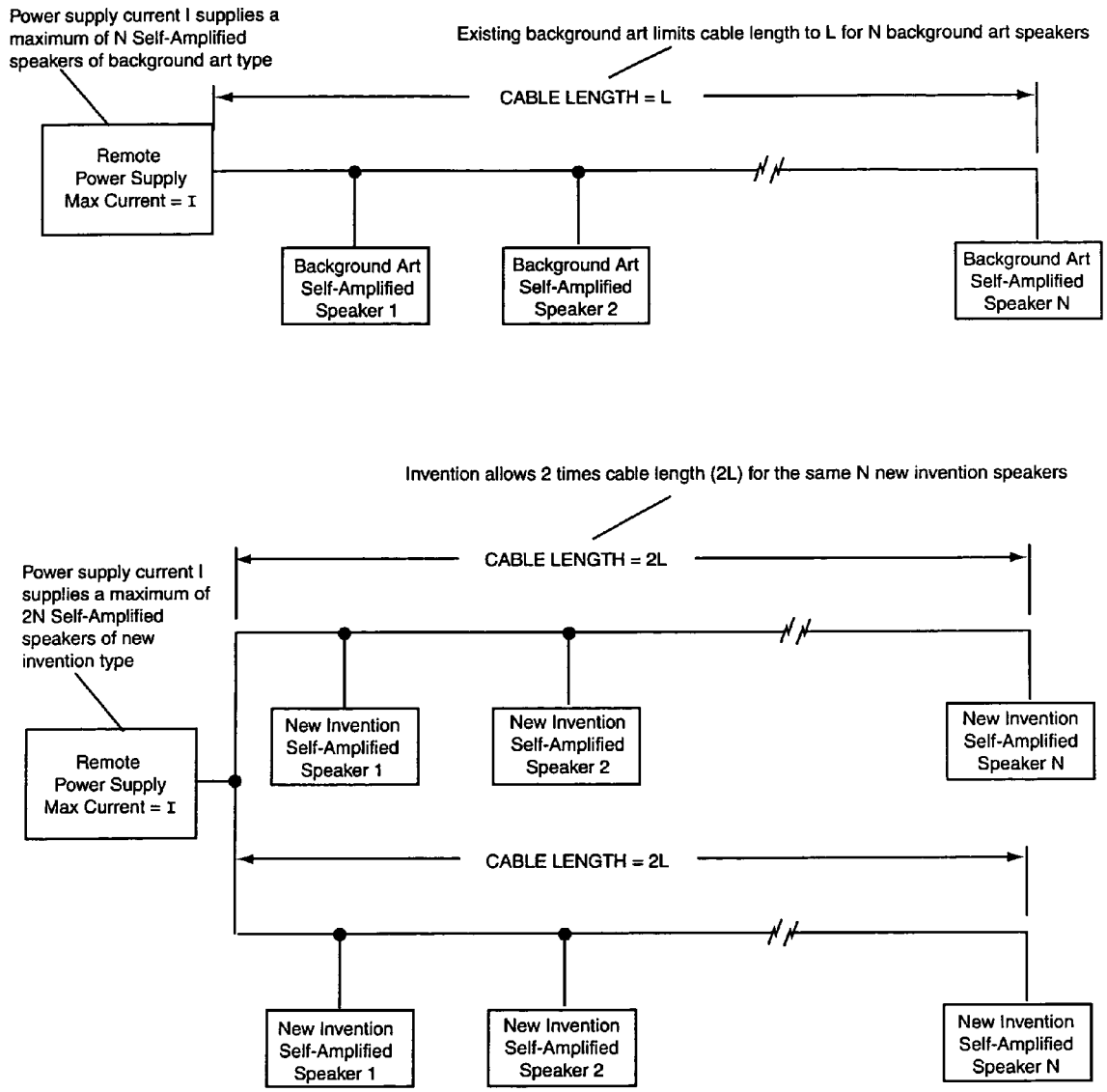
FIG. 7 shows a comparison of the capacity of the present invention and that of background art, analog-based self-amplified speaker systems when a plurality of self-amplified speakers are connected in parallel and are powered by a single power supply.

FIG. 7 shows a comparison of the reach of the present invention and that of background art, analog-based self-amplified speaker systems when a plurality of self-amplified speakers are connected in parallel and are powered by a single power supply. The present invention employs the miniature switching power amplifiers of the present invention in each of the self-amplified speakers. As illustrated in FIG. 7, use of a plurality of self-amplified speakers of the present invention reduces DC power consumption/current requirements up to as little as ½ that of typical analog-based power amplifier devices of the background art, under the same operating conditions.

In addition, as illustrated in FIG. 7, the system and apparatus of the present invention allows up to twice the conductor length or distance between the power supply and a self-amplified speaker. Additionally, the remote power supply can support twice the number of self-amplified speakers as compared to analog-based designs of the background art. It can also be seen from FIG. 7 that the present invention allows the distribution of twice as many self-amplified devices over twice the cable distance simply by using two equally outfitted circuit branches and employing devices from each branch alternatively along the cable run. The same single power supply located in the same physical place as in the background art is used, but significantly greater number of devices and physical distances are now accommodated without compromising system performance or robustness. Thus, the present invention enables the self-amplified speakers to be located further away from the power supply while still maintaining robust performance under the same operating conditions as background art analog-based systems.

Further, it is noted that the amplitude scaling of the reference triangle generator improves the power amplifier performance relative to power supply rejection and helps to maintains constant open-loop gain. Constant open loop gain is maintained by scaling the amplitude output of the reference triangle generator to the input power supply voltage, thus improving the rejection of degradation due to power supply variation due to, for example, distance from the remote power supply. Preferably, there is an amplitude scaled input directly tied from the remote power supply to the triangle generator.

Thus, the present invention utilizes Class D and other switching power amplifier topologies; amplitude scaling; and 2-pole, closed loop, negative feedback compensation to increase electrical efficiency and physical operating range; and to reduce power supply requirements, heat generation and physical size of self-amplified speaker apparatus and systems. These design characteristics of the present invention provide power amplifiers and speaker systems with the capability to operate with less total harmonic distortion and utilize at least twice as many self-amplified speaker systems or extend the operation range of such systems to at least twice the geographical distance of background art speaker systems.

The above is a non-limiting example of the apparatus and system of the present invention. However, the present invention is not restricted to horn loudspeakers and other types of transducer technologies, such as direct radiators and distributed mode loudspeakers are also applicable. Similar results are always obtained in electrical efficiency for various speaker types when using the system and apparatus of the present invention.

The foregoing description of the invention illustrates and describes the present invention. Additionally, the disclosure shows and describes only the preferred embodiments of the invention in the context of a method for increasing the yield of programmable logic devices, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What is claimed as new and desired to be protected by Letters Patent of the United States is:

1. A switching power amplifier apparatus, comprising:
a power supply and filtering stage;
an input transformer;
a variable gain amplifier;
dual comparators and output drivers;
an amplitude scaling triangle waveform generator; and
a switching power amplifier output stage,
a 2-pole compensated error amplifier with negative feedback from the switching power amplifier output stage,
wherein an audio signal is coupled to inputs of the input transformer; outputs of the input transformer are coupled to inputs of the variable gain amplifier; the output of the variable gain amplifier is coupled to an input of the 2-pole compensated error amplifier; the error amplifier is driven by the switching power amplifier output stage; an in-phase version of the error amplifier output is coupled to a first input of a first comparator of the dual comparators; an anti-phase version of the error amplifier output is coupled to a first input of a second comparator of the dual comparators; the amplitude scaling triangle waveform generator is connected to the power supply; a triangle waveform from the amplitude scaling triangle waveform generator is coupled to second inputs of the first comparator and the second comparator; outputs of the dual comparator are coupled to the output drivers, each of which provides complimentary digital outputs; and the complimentary digital outputs are coupled to inputs of the switching power amplifier output stage.

2. The switching power amplifier apparatus of claim 1, wherein the switching power amplifier feedback loop includes an error amplifier that provides 2-pole negative feedback compensation.

3. The switching power amplifier apparatus of claim 2, wherein the amplitude scaling triangle waveform generator tracks changes in the power supply.

4. The switching power amplifier apparatus of claim 3, wherein the power supply and filtering stage further comprises:
a full-wave bridge rectifier; and
a radio frequency interference filter,
wherein a positive voltage input and a negative voltage input of the power supply are coupled to a positive input and a negative input, respectively, of the full-wave bridge rectifier; a positive output and a negative output of the full-wave bridge rectifier are coupled to inputs of the radio frequency interference filter; and outputs of the radio frequency filter provide power supply voltages to the switching power amplifier apparatus.

5. The switching power amplifier apparatus of claim 4, wherein the switching power amplifier outputs are at least one of filtered and direct coupled.

6. The switching power amplifier apparatus of claim 5, wherein the switching power amplifier includes class D amplifiers configured to provide an average electrical efficiency of greater than 65%.

7. An integrated, self-amplified speaker system comprising:
the switching power amplifier apparatus of claim 6; and
a speaker,
wherein outputs of the switching power amplifier are coupled to a compression driver of the speaker.

8. The integrated, self-amplified speaker system of claim 7, wherein the compression driver further comprises:
a magnet;
a coil; and
a diaphragm,
wherein the outputs of the switching power amplifier are coupled to the input terminals of the compression driver, the coil is attached to input terminals of the compression driver, the magnet and the coil convert an electric field of the outputs of the switching amplifier into a magnetic field, and the diaphragm integrates the magnetic field into an acoustical output that drives the speaker.

9. The integrated, self-amplified speaker system of claim 8, wherein the compression driver further comprises a phase plug configured to improve the sensitivity of the compression driver.

10. The integrated, self-amplified speaker system of claim 9, wherein the speaker is a constant directivity re-entrant horn.

11. The integrated, self-amplified speaker system of claim 10, wherein voltage regulation and filtering, input transformer, audio signal input, variable gain amplifier, 2-pole compensated error amplifier, dual comparator and dual output driver, amplitude scaling triangle waveform generator, switching power amplifier output stage, and a switching power amplifier are enclosed in a sealed plastic end bell attached to the constant directivity re-entrant horn of the speaker.

12. The integrated, self-amplified speaker system of claim 11, wherein the constant directivity re-entrant horn of the speaker further comprises a rectangular conical section located at the distal end of the constant directivity re-entrant horn.

13. The integrated, self-amplified speaker system of claim 12, wherein the constant directivity re-entrant horn of the speaker further comprises structural braces configured to prevent vibration.

14. The integrated, self-amplified speaker system of claim 8, wherein the diaphragm is dome shaped.

15. The integrated, self-amplified speaker system of claim 13, wherein the diaphragm is a movable phenolic diaphragm.

16. The integrated, self-amplified speaker system of claim 15, wherein the phase plug is front loading.

17. The integrated, self-amplified speaker system of claim 16, wherein the phase plug is ring-shaped.

18. An integrated, self-amplified speaker system comprising:
at least one remote power supply and filtering stage;
an input transformer;
a variable gain amplifier;
dual comparators and output drivers;
a amplitude scaling triangle waveform generator;
a switching power amplifier output stage,
a 2-pole compensated error amplifier with negative feedback from the switching power amplifier output stage, and
a constant directivity re-entrant horn speaker, wherein, an audio signal is coupled to inputs of the input transformer; outputs of the input transformer are coupled to inputs of the variable gain amplifier; the output of the variable gain amplifier is coupled to an input of the 2-pole compensated error amplifier; the error amplifier is driven by the switching power amplifier output stage; an in-phase version of the error amplifier output is coupled to a first input of a first comparator of the dual comparators; an anti-phase version of the error amplifier output is coupled to a first input of a second comparator of the dual comparators; the amplitude scaling triangle waveform generator is connected to the power supply; a triangle waveform from the triangle waveform generator is coupled to second inputs of the first comparator and the second comparator; outputs of the dual comparator are coupled to the output drivers, each of which provides complimentary digital outputs; the complimentary digital outputs are coupled to inputs of the switching power amplifier; and outputs of the switching power amplifier are coupled to a compression driver of the constant directivity re-entrant horn.

* * * * *